US011674083B2

(12) United States Patent
Konno et al.

(10) Patent No.: US 11,674,083 B2
(45) Date of Patent: Jun. 13, 2023

(54) THERMOPLASTIC LIQUID CRYSTAL POLYMER AND FILM OF SAME

(71) Applicant: Kuraray Co., Ltd., Kurashiki (JP)

(72) Inventors: Takafumi Konno, Saijo (JP); Tatsuya Sunamoto, Chiyoda-ku (JP); Michiyuki Nanba, Kurashiki (JP); Tetsuya Hara, Kurashiki (JP)

(73) Assignee: KURARAY CO., LTD., Kurashiki (JP)

( * ) Notice: Subject to any disclaimer, the term of this patent is extended or adjusted under 35 U.S.C. 154(b) by 33 days.

(21) Appl. No.: 16/577,105

(22) Filed: Sep. 20, 2019

(65) Prior Publication Data

US 2020/0017769 A1    Jan. 16, 2020

Related U.S. Application Data

(63) Continuation of application No. PCT/JP2018/012219, filed on Mar. 26, 2018.

(30) Foreign Application Priority Data

Mar. 31, 2017 (JP) .............................. JP2017-071337

(51) Int. Cl.
| C09K 19/38 | (2006.01) |
| C08G 63/60 | (2006.01) |
| C09K 19/32 | (2006.01) |
| H05K 1/05  | (2006.01) |

(52) U.S. Cl.
CPC ........ *C09K 19/3809* (2013.01); *C08G 63/605* (2013.01); *C09K 19/322* (2013.01); *H05K 1/056* (2013.01); *C09K 2219/11* (2013.01)

(58) Field of Classification Search
CPC .. C09K 19/42; C09K 19/3809; C09K 19/322; C09K 2219/11; C08G 63/605; C08J 2367/03; C08J 5/18; H05K 1/056
See application file for complete search history.

(56) References Cited

U.S. PATENT DOCUMENTS

| 4,327,206 A | 4/1982 | Jackson, Jr. et al. |
| 5,171,823 A | 12/1992 | Charbonneau et al. |
| 5,688,895 A | 11/1997 | Plotzker et al. |
| 6,984,712 B2 | 1/2006 | Ueno et al. |
| 7,014,921 B2 | 3/2006 | Okamoto et al. |
| 7,063,892 B2 | 6/2006 | Okamoto et al. |
| 8,044,151 B2 | 10/2011 | Asahara et al. |
| 9,074,070 B2 * | 7/2015 | Yung ........................ C08K 3/22 |
| 2004/0152865 A1 | 8/2004 | Okamoto et al. |
| 2005/0054811 A1 | 3/2005 | Ueno et al. |
| 2005/0113555 A1 | 5/2005 | Okamoto et al. |
| 2007/0010647 A1 | 1/2007 | Ueno et al. |
| 2009/0111964 A1 | 4/2009 | Asahara et al. |
| 2020/0017769 A1 * | 1/2020 | Konno .................... B32B 27/28 |

FOREIGN PATENT DOCUMENTS

| CN | 1615325 A | 5/2005 | |
| CN | 1629255 A | 6/2005 | |
| CN | 101423599 A | 5/2009 | |
| CN | 102643415 A | 8/2012 | |
| JP | 10-316895 A | 12/1998 | |
| JP | 11-513065 A | 11/1999 | |
| JP | 2000-238208 A | 9/2000 | |
| JP | 2004-196930 A | 7/2004 | |
| JP | 2005-105232 A | 4/2005 | |
| JP | 2005-126652 A | 5/2005 | |
| JP | 2005-272810 A | 10/2005 | |
| JP | 2006-233118 * | 9/2006 | .............. C08L 67/03 |
| JP | 2006-233118 A | 9/2006 | |
| JP | 2009-108190 A | 5/2009 | |
| JP | 2009-127025 A | 6/2009 | |
| WO | WO 97/49753 A1 | 12/1997 | |

OTHER PUBLICATIONS

International Search Report dated May 29, 2018 in PCT/JP2018/012219 filed on Mar. 26, 2018 (with English Translation).
Mori, K, et al., "Temperature evaluation at sample location and measurement of the liquid crystal polymer film's complex permittivity by temperature-controlled waveguide penetration method", Program of Society Conference 2016, the Institute of Electronics, Information and Communication Engineers, B-4-44, 8 pages (with English Translation).
English Translation of Office Action in TW Application No. 107111005, dated May 14, 2021, 5pp.
Office Action in JP application No. 2019-509835, dated Oct. 19, 2021, 9pp.

\* cited by examiner

*Primary Examiner* — Geraldina Visconti

(74) *Attorney, Agent, or Firm* — Hauptman Ham, LLP

(57) ABSTRACT

Provided are a thermoplastic polymer capable of reducing a dielectric dissipation factor in high frequency bands and a film thereof. The thermoplastic liquid crystal polymer includes repeating units represented by the following formulae (I), (II), (III) and (IV), in which a molar ratio of a total amount of the repeating units represented by formulae (I) and (II) to a total amount of all the repeating units in the thermoplastic liquid crystal polymer is 50 to 90 mol %, and a molar ratio of the repeating unit represented by formula (III) to the repeating unit represented by formula (IV) is the former/the latter=23/77 to 77/23.

14 Claims, No Drawings

THERMOPLASTIC LIQUID CRYSTAL POLYMER AND FILM OF SAME

CROSS REFERENCE TO THE RELATED APPLICATION

This application is a continuation application, under 35 U.S.C § 111(a) of international application No. PCT/JP2018/012219, filed Mar. 26, 2018, which claims priority to Japanese patent application No. 2017-071337, filed Mar. 31, 2017, the entire disclosure of which is herein incorporated by reference as a part of this application.

FIELD OF THE INVENTION

The present invention relates to a thermoplastic polymer capable of forming an optically anisotropic melt phase (hereinafter, referred to as a thermoplastic liquid crystal polymer). More particularly, the present invention relates to a thermoplastic liquid crystal polymer capable of reducing a dielectric dissipation factor in high frequency bands as well as of having a controlled rise in the melting point.

BACKGROUND OF THE INVENTION

Recently, there has been remarkable advances in the field of information devices, e.g., personal computers, and in the field of communication devices, e.g., cell phones or smartphones. The frequencies used in such electronics and/or communication devices have been shifted to the gigahertz bands.

As information and communication devices adapted for high frequencies, for example, there have been developed millimeter-wave radars used for detecting inter-vehicle distances for the purpose of safe driving assistance and of driving automation in vehicles. Such millimeter-wave radars have antennas for receiving and transmitting electromagnetic wave signals, and there is a demand for a material with a low dielectric dissipation factor, in particular, in high frequency bands, for insulating substrates used for the antennas.

As the insulating substrates for the antennas, although there has been known ceramic substrates and fluororesin substrates, the ceramic substrates have problems that they are difficult to process and cost a lot, while the fluororesin substrates cannot attain high frequency characteristics and are poor in moisture resistance as a whole due to adverse effect by glass cloth that enhances dimensional stability.

In contrast, a thermoplastic liquid crystal polymer has been increasingly attracting attention as a material having excellent high frequency characteristics. For example, Patent Document 1 (JP Laid-open Patent Publication No. 2009-108190) discloses a wholly aromatic liquid crystal polyester containing a repeating unit derived from 6-hydroxy-2-naphthoic acid, a repeating unit derived from 4,4'-dihydroxybiphenyl, and a repeating unit derived from an aromatic dicarboxylic acid in a predetermined ratio, wherein the wholly aromatic liquid crystal polyester further contains a small amount of a repeating unit derived from benzenediol.

Patent Document 2 (JP Laid-open Patent Publication No. 2004-196930) discloses an aromatic liquid crystal polyester substantially containing 30 to 80 mol % of a repeating unit derived from 2-hydroxy-6-naphthoic acid, 35 to 10 mol % of a repeating unit derived from an aromatic diol, and 35 to 10 mol % of a repeating unit derived from an aromatic dicarboxylic acid.

Patent Document 3 (JP Laid-open Patent Publication No. 2005-272810) discloses an aromatic liquid crystal polyester containing 40 to 74.8 mol % of a repeating unit derived from 2-hydroxy-6-naphthoic acid, 12.5 to 30 mol % of a repeating unit derived from an aromatic diol, 12.5 to 30 mol % of a repeating unit derived from a naphthalenedicarboxylic acid, and 0.2 to 15 mol % of a repeating unit derived from an aromatic dicarboxylic acid, wherein the number of moles of the repeating unit derived from the naphthalenedicarboxylic acid is greater than that of the repeating unit derived from the aromatic dicarboxylic acid.

SUMMARY OF THE INVENTION

Problems to be Solved by the Invention

Although Patent Document 1 states that the wholly aromatic liquid crystal polyester is excellent in mechanical properties as well as dielectric characteristics in high frequency bands, Patent Document 1 determined strength properties and a dielectric dissipation factor of polymer test pieces in a dumbbell shape or in a stick shape processed via injection molding. Therefore, the document does not describe the polymer in terms of processability as a film or a dielectric dissipation factor when the polyester is used as a film.

Patent Document 2 has an object of improving the dielectric loss in the megahertz bands so that there is a need to lower the dielectric dissipation factor in higher frequency bands.

Patent Document 3 states that it provides an aromatic liquid crystal polyester having well-balanced heat resistance and film processability as well as small dielectric loss. However, the polymer obtained in Patent Document 3 cannot reduce rise in the melting point because there is a trade-off between the melting point and heat resistance. Thus, there is a demand for a polymer with an even lower dielectric dissipation factor.

Accordingly, an object of the present invention is to provide a thermoplastic liquid crystal polymer capable of reducing a dielectric dissipation factor in high frequency bands and of reducing rise in the melting point.

Another object of the present invention is to provide a thermoplastic liquid crystal polymer film having an extremely low dielectric dissipation factor in the high frequency bands.

Means for Solving the Problems

After intensive investigation to achieve the above objects, (1) the inventors of the present invention focused attention on the carbonyl group forming a permanent dipole in the thermoplastic liquid crystal polymer, studied its orientation and rotation property and found that it is possible to achieve an extremely low dielectric dissipation factor in the thermoplastic liquid crystal polymer by the liquid crystal polymer that has a specific ratio of repeating units of a bulky naphthalene ring as an aromatic ring bonded to a carbonyl group in the all repeating units, so that the carbonyl group can have greater rotational energy and have a reduced rotational motion component in the gigahertz band. At the same time, the inventors have found as a new problem that when the polymer contains repeating units having a naphthalene ring, such polymers have difficulty for film production because of the enhanced melting point so that the inventors needed further study. As a result of further investigation, the inventors have finally found that (2) by using two repeating units having different structures as repeating units, each derived from an aromatic diol, for forming the thermoplastic liquid crystal polymer, and by setting a blending ratio of the two repeating units, each derived from an aromatic diol, to be within a specific range, the polymer is less likely to have a strong crystalline structure, which makes it possible to reduce rise in melting point in spite of the polymer containing a desired amount of the repeating units, each having a naphthalene ring. In this way, the inventors achieved the present invention.

That is, the present invention may have the following aspects.

Aspect 1

A thermoplastic polymer capable of forming an optically anisotropic melt phase (hereinafter, referred to as a thermoplastic liquid crystal polymer), the thermoplastic liquid crystal polymer including repeating units represented by the following formulae (I), (II), (III) and (IV), wherein a molar ratio of a total amount of the repeating units represented by formulae (I) and (II) to a total amount of all the repeating units in the thermoplastic liquid crystal polymer is 50 to 90 mol % (preferably 55 to 85 mol %, more preferably 60 to 80 mol %), and a molar ratio of the repeating unit represented by formula (III) to the repeating unit represented by formula (IV) is the former/the latter=23/77 to 77/23 (preferably 25/75 to 75/25, more preferably 30/70 to 70/30, particularly preferably 35/65 to 65/35).

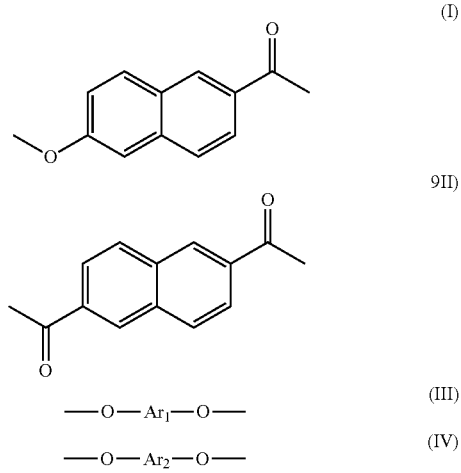

Wherein $Ar_1$ and $Ar_2$ represent divalent aromatic groups that are different from each other.

Aspect 2

The thermoplastic liquid crystal polymer according to aspect 1, wherein a molar ratio of the repeating unit represented by formula (I) to the repeating unit represented by formula (II) is the former/the latter=45/55 to 90/10 (more preferably 55/45 to 85/15, and still more preferably 60/40 to 80/20).

Aspect 3

The thermoplastic liquid crystal polymer according to aspect 1 or 2, wherein a molar ratio of the repeating unit represented by the formula (II) to a total amount of all the repeating units derived from dicarboxylic acids in the thermoplastic liquid crystal polymer is 85 mol % or higher (preferably 90 mol % or higher, more preferably 95 mol % or higher, still more preferably 98 mol % or higher, particularly preferably 100 mol %).

Aspect 4

The thermoplastic liquid crystal polymer according to any one of aspects 1 to 3, wherein $Ar_1$ and $Ar_2$ are different from each other; each of $Ar_1$ and $Ar_2$ is selected from a group consisting of 1,4-phenylene, 1,3-phenylene, 1,5-naphthylene, 2,6-naphthylene, 4,4'-biphenylene, 2,6-anthraquinonylene, and a divalent residue having two or more phenylenes linked by a linking group at the para-position; the linking group is selected from a group consisting of a carbon-carbon bond, an oxy group, an alkylene group with 1 to 3 carbon atoms, an amino group, a carbonyl group, a sulfide group, a sulfinyl group, and a sulfonyl group; and each of $Ar_1$ and $Ar_2$ may optionally have a substituent selected from a group consisting of a $C_{1-3}$ alkyl group, a halogen atom, and a phenyl group.

Aspect 5

The thermoplastic liquid crystal polymer according to any one of aspects 1 to 4, wherein the repeating units represented by formulae (III) and (IV) are two repeating units derived from two aromatic diols, the two aromatic diols being selected from hydroquinone, 4,4'-dihydroxybiphenyl, phenylhydroquinone, and 4,4'-dihydroxydiphenyl ether.

Aspect 6

The thermoplastic liquid crystal polymer according to any one of aspects 1 to 5, wherein the thermoplastic liquid crystal polymer has a temperature difference between a melting point and a solidifying temperature in a range of 40 to 160° C. (more preferably 45 to 155° C.).

Aspect 7

A thermoplastic liquid crystal polymer film including the thermoplastic liquid crystal polymer recited in any one of aspects 1 to 6.

Aspect 8

The thermoplastic liquid crystal polymer film according to aspect 7, wherein the thermoplastic liquid crystal polymer film has a dielectric dissipation factor of 0.0007 or lower (more preferably 0.0006 or lower) at 25° C. and 5 GHz.

Aspect 9

A metal-clad laminate including the thermoplastic liquid crystal polymer film recited in aspect 7 or 8 and a metal layer bonded to at least one surface of the thermoplastic liquid crystal polymer film.

Aspect 10

A circuit board including at least one conductor layer and the thermoplastic liquid crystal polymer film recited in aspect 7 or 8.

Aspect 11

The circuit board according to aspect 10, wherein the circuit board is a multilayered circuit.

Aspect 12

The circuit board according to aspect 10 or 11, wherein the circuit board includes a semiconductor element mounted thereon.

Aspect 13

A vehicular radar including the circuit board recited in any one of aspects 10 to 12.

The present invention encompasses any combination of at least two features disclosed in the claims and/or the specification. In particular, the present invention encompasses any combination of at least two claims.

Effect of the Invention

The present invention can provide a thermoplastic liquid crystal polymer which is capable of having not only an extremely low dielectric dissipation factor, but also a reduced melting point.

Further, a film of a thermoplastic liquid crystal polymer according to the present invention is suitably applicable as a unit constituting a vehicle radar (for example, a unit constituting a millimeter-wave antenna) because the film has an extremely low dielectric dissipation factor in high frequency bands.

DESCRIPTION OF THE EMBODIMENTS

Thermoplastic Liquid Crystal Polymer

A thermoplastic liquid crystal polymer according to the present invention at least includes repeating units represented by the following formulae (I), (II), (III) and (IV) in a specific ratio.

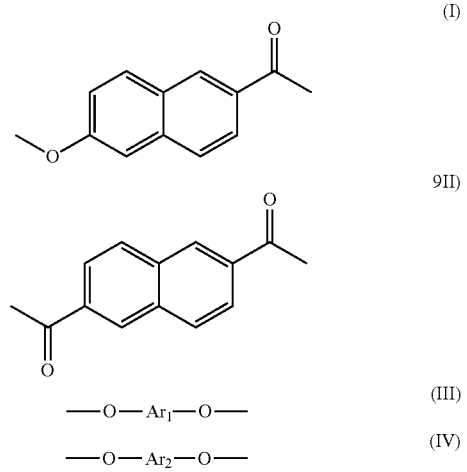

—O—$Ar_1$—O— (III)

—O—$Ar_2$—O— (IV)

Wherein $Ar_1$ and $Ar_2$ represent divalent aromatic groups that are different from each other.

Repeating Units Represented by Formulae (I) and (II)

Examples of monomers for a repeating unit represented by formula (I) may include 6-hydroxy-2-naphthoic acid and derivatives thereof. Examples of monomers for a repeating unit represented by formula (II) may include 2,6-naphthalenedicarboxylic acid and derivatives thereof. It should be understood that the term "derivative(s)" used herein includes, for example, ester-forming derivatives, such as acylated compounds, ester derivatives and acid halides, as well as that names of compounds used hereinafter also refer to derivatives thereof.

In order to suppress the dielectric dissipation factor in the gigahertz bands, in the thermoplastic liquid crystal polymer according to the present invention, a molar ratio of a total amount of the repeating units represented by formula (I) and formula (II) is in a range of 50 to 90 mol % relative to a total amount of all the repeating units. By using, as an aromatic ring repeating unit bonded to the carbonyl group, a bulky naphthalene ring repeating unit having a total molar amount range as described above relative to the total amount of all the repeating units, presumably because this structure contributes to enhanced rotational energy of carbonyl groups in ester bonds as permanent dipoles in the thermoplastic liquid crystal polymer, it is possible to suppress increase in the dielectric dissipation factor caused by energy dissipation into heat due to rotational motion of permanent dipoles.

The molar ratio of the total amount of the repeating units represented by formula (I) and formula (II) to the total amount of all the repeating units may be preferably 55 to 85 mol % and more preferably 60 to 80 mol %. The molar ratio of the total amount of the repeating units represented by formula (I) and formula (II) to the total amount of all the repeating units of less than 50 mol % is not preferable because of the increased dielectric dissipation factor.

In order to suppress energy dissipation into heat caused by rotational motion of carbonyl groups, the molar ratio of the repeating unit represented by formula (I) to the total amount of all the repeating units derived from hydroxycarboxylic acids in the thermoplastic liquid crystal polymer may be, for example, 85 mol % or higher, preferably 90 mol % or higher, more preferably 95 mol % or higher, still more preferably 98 mol % or higher, and particularly preferably 100 mol %.

In order to suppress energy dissipation into heat caused by rotational motion of the carbonyl group, the molar ratio of the repeating unit represented by formula (II) to the total amounts of all the repeating units derived from dicarboxylic acids in the thermoplastic liquid crystal polymer may be, for example, 85 mol % or higher, preferably 90 mol % or higher, more preferably 95 mol % or higher, still more preferably 98 mol % or higher, and particularly preferably 100 mol %.

In order to lower the melting point of the thermoplastic liquid crystal polymer, the molar ratio of the repeating unit represented by formula (I) to the repeating unit represented by formula (II) may be preferably the former/the latter=45/55 to 90/10, more preferably 55/45 to 85/15, and still more preferably 60/40 to 80/20.

Repeating Units Represented by Formulae (III) and (IV)

The repeating units represented by formulae (III) and (IV) are repeating units derived from divalent aromatic diols which are different from each other.

In order to lower the melting point of the thermoplastic liquid crystal polymer containing large amounts of the repeating units of formulae (I) and (II), the thermoplastic liquid crystal polymer according to the present invention has a molar ratio of the repeating unit represented by formula (III) to the repeating unit represented by formula (IV) in a range of the former/the latter=23/77 to 77/23. The melting point of the polymer can be lowered probably because of avoidance of strong crystalline structure being produced by using two repeating units derived from aromatic diols constituting the thermoplastic liquid crystal polymer, both units being different from each other in a specific constitution ratio of the two repeating units.

The molar ratio of the repeating unit represented by formula (III) to repeating unit represented by formula (IV) may be preferably 25/75 to 75/25, more preferably 30/70 to 70/30, and particularly preferably 35/65 to 65/35.

For example, in the repeating units represented by formulae (III) and (IV), $Ar_1$ and $Ar_2$ are different from each other; each of $Ar_1$ and $Ar_2$ may be selected from a group consisting of 1,4-phenylene, 1,3-phenylene, 1,5-naphthylene, 2,6-naphthylene, 4,4'-biphenylene, 2,6-anthraquinonylene, and a divalent residue having two or more phenylenes linked by a linking group at the para-position; and the linking group may be selected from a group consisting of a carbon-carbon bond, an oxy group, an alkylene group with 1 to 3 carbon atoms, an amino group, a carbonyl group, a sulfide group, a sulfinyl group, and a sulfonyl group. $Ar_1$ and $Ar_2$ may optionally have a substituent (for example, a lower alkyl group such as a $C_{1-3}$ alkyl group, a halogen atom, and a phenyl group).

Examples of monomers for the repeating units represented by formulae (III) and (IV) may include aromatic diol compounds selected from an exemplary group shown in Table 1 below and derivatives thereof.

TABLE I

Chemical structural formulae of representative examples of aromatic diol compounds

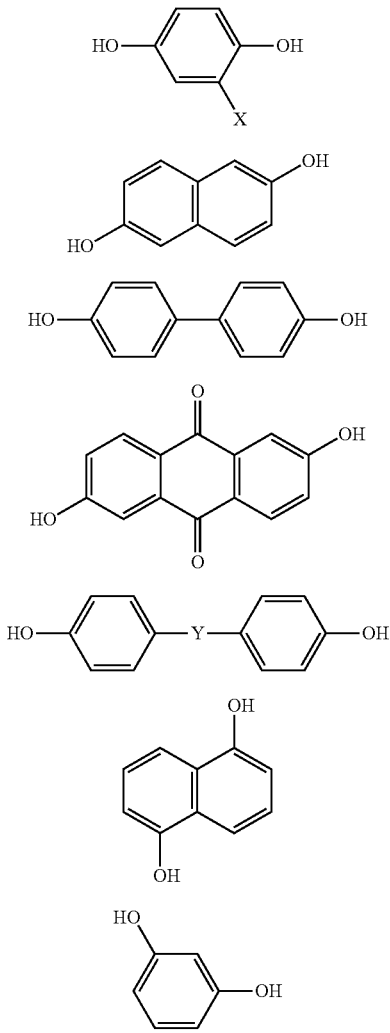

X represents a hydrogen atom or a halogen atom, or a group such as a lower alkyl (e.g., $C_{1-3}$ alkyl) or a phenyl
Y represents a group such as —O—, —CH$_2$—, —S—, —CO—, —C(CH$_3$)$_2$—, or —SO$_2$—

In order to obtain good flow characteristics while maintaining dielectric characteristics of the thermoplastic liquid crystal polymer, monomers for the repeating units represented by formulae (III) and (IV) are preferably selected from linear aromatic diol compounds. For example, such linear aromatic diol compounds preferably have linear portion (for example, at the para-position or the 2,6-position) forming the main chain of the thermoplastic liquid crystal polymer.

Preferably, in the repeating units represented by formulae (III) and (IV), Ar$_1$ and Ar$_2$ are different from each other; each of Ar$_1$ and Ar$_2$ may be selected from a group consisting of 1,4-phenylene, 2,6-naphthylene, 4,4'-biphenylene, 2,6-anthraquinonylene, and a divalent residue having two or more phenylenes linked by a linking group at the para-position; the linking group may be selected from a group consisting of a carbon-carbon bond, an oxy group, an alkylene group with 1 to 3 carbon atoms, and a carbonyl group; and Ar$_1$ and Ar$_2$ may optionally have a substituent (for example, a lower alkyl group such as a $C_{1-3}$ alkyl group, and a phenyl group).

The inventors have further found that when the above thermoplastic liquid crystal polymer includes a specific combination of the repeating units represented by formulae (III) and (IV), it is possible to maintain a low dielectric dissipation factor without disturbing liquid crystallinity.

In particular, monomers for the repeating units represented by formulae (III) and (IV) are preferably two aromatic diol compounds selected from hydroquinone, 4,4'-dihydroxybiphenyl, phenylhydroquinone, and 4,4'-dihydroxydiphenyl ether. In particular, at least one of the monomers for the repeating units represented by formulae (III) and (IV) preferably has a biphenyl moiety. Monomers having a biphenyl moiety contribute to decrease in the dielectric dissipation factor because the biphenyl moiety existence makes it possible to reduce the ratio of the permanent dipole ester group to the molecular weight.

Further, it is preferable to combine the repeating units substantially represented by formulae (III) and (IV) with the repeating unit represented by formula (II). The molar ratio of the repeating unit represented by formula (II) to the total amount of the repeating units represented by formulae (III) and (IV) may be, for example, 90/100 to 100/90, preferably 95/100 to 100/95, and more preferably 100/100.

It should be noted that, as long as the effect of the present invention can be obtained, the thermoplastic liquid crystal polymer according to the present invention may include a repeating unit derived from aliphatic diol compounds, such as HO(CH$_2$)$_n$OH (n is an integer from 2 to 12).

Additionally, as long as the effect of the present invention can be obtained, the thermoplastic liquid crystal polymer according to the present invention may include a repeating unit used in known thermoplastic liquid crystal polyesters, such as a repeating unit derived from diols, a repeating unit derived from dicarboxylic acids, a repeating unit derived from hydroxycarboxylic acids, and a repeating unit derived from aromatic diamines, aromatic hydroxyamines, or aromatic aminocarboxylic acids. For example, the thermoplastic liquid crystal polymer may include a repeating unit derived from the compounds classified in the following Tables 2 to 4.

Aromatic or aliphatic dicarboxylic acids (see Table 2 for representative examples)

TABLE 2

Chemical structural formulae of representative examples of aromatic or aliphatic dicarboxylic acids

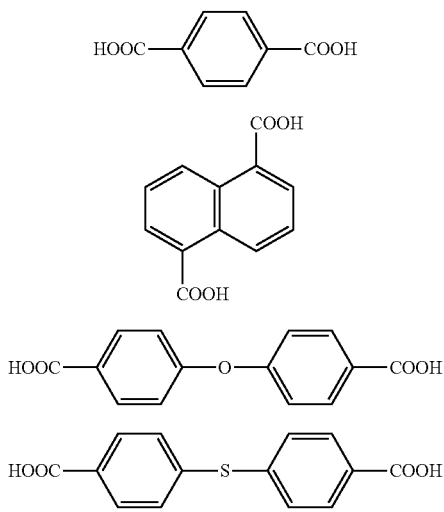

TABLE 2-continued

Chemical structural formulae of representative examples of aromatic or aliphatic dicarboxylic acids

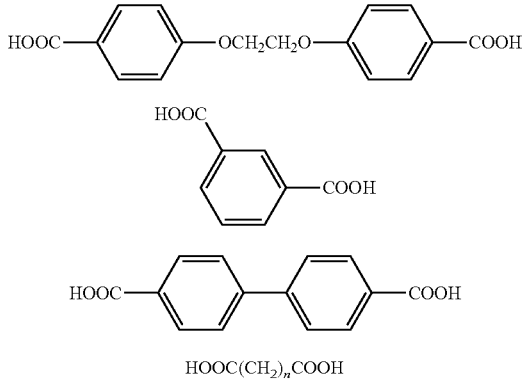

HOOC(CH$_2$)$_n$COOH n is an integer of 2 to 12

Aromatic hydroxycarboxylic acids (see Table 3 for representative examples)

TABLE 3

Chemical structural formulae of representative examples of aromatic hydroxycarboxylic acids

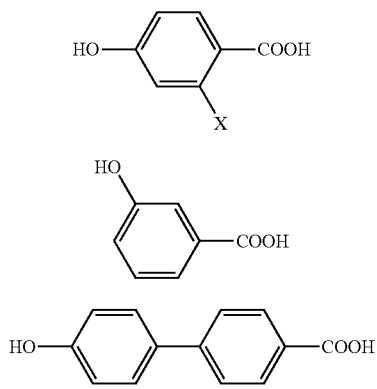

X represents a hydrogen atom or a halogen atom, or a group such as a lower alkyl (e.g., C$_{1-3}$ alkyl) or a phenyl Aromatic diamines, aromatic hydroxyamines, or aromatic aminocarboxylic acids (see Table 4 for representative examples)

TABLE 4

Chemical structural formulae of representative examples of aromatic diamines, aromatic hydroxy amines, or aromatic aminocarboxylic acids

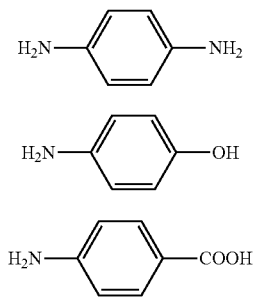

Further, the thermoplastic liquid crystal polymer according to the present invention is not particularly limited as long as the effect of the present invention can be obtained, and may also be, other than the thermoplastic liquid crystal polyester including the respective repeating units described above, a thermoplastic liquid crystal polyesteramide that is the above thermoplastic liquid crystal polyester with an amide bond incorporated thereto. The thermoplastic liquid crystal polymer may also be a polymer that is an aromatic polyester or an aromatic polyesteramide with, e.g., an imide bond, a carbonate bond, a carbodiimide bond, or an isocyanate-derived bond such as an isocyanurate bond incorporated thereto.

It should be noted that in the present invention, capability of forming an optically anisotropic melt phase can be determined by, for example, placing a sample on a hot stage, heating the sample with an elevating temperature under a nitrogen atmosphere, and observing light transmitted through the sample.

The thermoplastic liquid crystal polymer of the present invention can have a reduced melting point in spite of containing a specific amount of the repeating unit having a naphthalene ring. For example, the polymer may have a melting point (hereinafter, referred to as Tm$_0$) preferably in a range from 260 to 330° C. (for example, from 270 to 330° C.), and more preferably from 270 to 320° C. (for example, from 290 to 320° C.). Since the thermoplastic liquid crystal polymer of the present invention has a melting point within a predetermined range, it is possible to melt-extrude the thermoplastic liquid crystal polymer at a lower temperature, to achieve good film formability as well as to suppress thermal decomposition of the thermoplastic liquid crystal polymer. It should be noted that the melting point is a value measured according to the method recited in Examples described later.

The thermoplastic liquid crystal polymer according to the present invention is preferably capable of achieving not only a reduced melting point, but also a large temperature difference between the melting point and the solidifying temperature. For example, the temperature difference between the melting point and the solidifying temperature may be preferably in a range from 40 to 160° C., and more preferably in a range from 45 to 155° C. In a film formation process, where the temperature difference between the melting point and the solidifying temperature is within the above range, a sufficient time is ensured from melting to solidification of the thermoplastic liquid crystal polymer during melt film formation of the thermoplastic liquid crystal polymer so as to enhance flexibility in temperature condition settings, such as the film formation temperature.

It should be noted that the term "solidifying temperature" refers to a peak temperature of crystallization (crystallization temperature) in a cooling process of a DSC measurement, but if a crystallization temperature is not observed, the term "solidifying temperature" refers to a glass transition temperature. Specifically, a solidifying temperature is measured according to the method recited in Examples described later. Additionally, temperature difference between a melting point and a solidifying temperature of a thermoplastic liquid crystal polymer is calculated by subtracting the solidifying temperature from the melting point.

The thermoplastic liquid crystal polymer may be a resin composition containing other component(s). The resin composition may comprise any thermoplastic polymer such as a polyethylene terephthalate, a modified polyethylene terephthalate, a polyolefin, a polycarbonate, a polyarylate, a polyamide, a polyphenylene sulfide, a polyether ether ketone, and a fluorine resin; and/or various additives, as long as the advantageous effect of the present invention is not deteriorated. If necessary, the resin composition may comprise a filler.

Method for Producing Thermoplastic Liquid Crystal Polymer

The method for producing a thermoplastic liquid crystal polymer according to the present invention is not particularly limited, and the thermoplastic liquid crystal polymer can be synthesized by a known polycondensation method. Direct polymerization may be performed using 6-hydroxy-2-naphthoic acid, 2,6-naphthalenedicarboxylic acid, and any aromatic diols as monomers for polycondensation. The monomers such as 6-hydroxy-2-naphthoic acid and aromatic diols may be used in the polymerization in the form of acylated compounds obtained by acylating the hydroxy groups in these monomers to activate their terminals.

As the acylated compounds of the monomers, monomers may be reacted with an acylating agent in advance. Alternatively, an acylating agent is added to the monomers in a reaction system in the process of producing the thermoplastic liquid crystal polymer. Examples of the acylating agent may include acid anhydrides, such as acetic anhydride.

The polycondensation may be performed in presence of various catalysts, including an organic tin-based catalyst (such as dialkyltin oxide), an antimony-based catalyst (such as antimony trioxide), a titanium-based catalyst (such as titanium dioxide), any of alkali metal salts or alkaline earth metal salts of carboxylic acids (such as potassium acetate), and a Lewis acid (such as $BF_3$), for example.

After polycondensation is carried out by polymerization in the melt phase, solid-phase polymerization may be further carried out. In the solid-phase polymerization, for example, the polymer thus obtained in the melt polymerization step is subjected to crushing into powder or flakes, and then performing heat treatment in the solid phase under vacuum or under an inert atmosphere, such as nitrogen.

Method for Producing Thermoplastic Liquid Crystal Polymer Film

Since the thermoplastic liquid crystal polymer of the present invention is capable of having a reduced melting point in spite of containing a predetermined amount of the repeating units having a naphthalene ring, films can be suitably produced from the thermoplastic liquid crystal polymer. The thermoplastic liquid crystal polymer film can be obtained, for example, by extruding the melt-kneaded product of the thermoplastic liquid crystal polymer.

Any method may be used for extruding the polymer, and industrially advantageous well-known methods, such as a T-die method or an inflation method, are used. In particular, in the inflation method, stress can be applied not only in a machine direction of a film (hereinafter, abbreviated as an MD direction), but also in a transverse direction (hereinafter, abbreviated as a TD direction) perpendicular to the MD direction, which allows the film to be uniformly stretched in the MD direction and the TD direction. Accordingly, it is possible to obtain a film having controlled properties such as molecular orientation and dielectric characteristics in both the MD and TD directions.

For example, in extrusion molding using a T-die method, a film may be formed by stretching a molten polymer sheet extruded from a T-die in the MD direction and the TD direction of a film at the same time, or alternatively, a film may be formed by stretching a molten polymer sheet extruded from a T-die in sequence, first in the MD direction and then the TD direction.

Also, in the extrusion molding using an inflation method, a film may be formed by drawing a tubular sheet melt-extruded from an annular die in a predetermined draw ratio (corresponding to a stretching ratio in the MD direction) and a predetermined blow ratio (corresponding to a stretching ratio in the TD direction).

The stretching ratios used in such extrusion molding may be, as a stretching ratio in the MD direction (or a draw ratio), for example, about 1.0 to 10, preferably about 1.2 to 7, and more preferably about 1.3 to 7; and/or as a stretching ratio in the TD direction (or a blow ratio), for example, about 1.5 to 20, preferably about 2 to 15, and still more preferably about 2.5 to 14.

If necessary, a known or conventional heat treatment may be carried out in order to control a melting point and/or a thermal expansion coefficient of the thermoplastic liquid crystal polymer film. Heat treatment conditions can be set appropriately depending on the purpose. The heat treatment may be carried out by heating for hours at a temperature of, for example, $(Tm_0-10)°$ C. or higher, wherein $Tm_0$ denotes a melting point of a thermoplastic liquid crystal polymer, for example, about $(Tm_0-10)°$ C. to $(Tm_0+30)°$ C., and preferably about $Tm_0°$ C. to $(Tm_0+20)°$ C. to increase a melting point (Tm) of the thermoplastic liquid crystal polymer film.

Thermoplastic Liquid Crystal Polymer Film

According to one embodiment of the present invention, a thermoplastic liquid crystal polymer film is formed from the above thermoplastic liquid crystal polymer. The thermoplastic liquid crystal polymer film can have an extremely low dielectric dissipation factor because the thermoplastic liquid crystal polymer constituting the film has a specific amount in the repeating units as the total amount of the repeating unit represented by formula (I) and the repeating unit represented by formula (II).

Dielectric Dissipation Factor

According to one embodiment of the present invention, a thermoplastic liquid crystal polymer film may have, for example, a dielectric dissipation factor of 0.0007 or lower and more preferably 0.0006 or lower at 25° C. and 5 GHz. It should be noted that a dielectric dissipation factor is a value measured according to the method recited in Examples described later. The dielectric dissipation factor is calculated as an average of dielectric dissipation factors measured at 5 GHz in one direction (X direction) and a transverse direction (Y direction) perpendicular to the X direction.

According to one embodiment of the present invention, a thermoplastic liquid crystal polymer film can preferably have a low dielectric dissipation factor in higher frequency bands as well. For example, the dielectric dissipation factor at 40° C. and 24 GHz may be 0.0012 or lower, and more preferably 0.0010 or lower. It should be noted that a dielectric dissipation factor at 40° C. and 24 GHz is a value measured according to the method recited in Examples described later.

According to one embodiment of the present invention, a thermoplastic liquid crystal polymer film can preferably have a low dielectric dissipation factor at a high temperature (for example, 120° C.) as well. For example, the dielectric dissipation factor at 120° C. and 24 GHz may be 0.0025 or lower, and more preferably 0.0022 or lower, and still more preferably 0.0020 or lower. It should be noted that a dielectric dissipation factor at 120° C. and 24 GHz is a value measured according to the method recited in Examples described later.

Since the thermoplastic liquid crystal polymer film of the present invention has an extremely low dielectric dissipation factor, it can suitably be used as a substrate material, in particular, as a substrate material used in a radar adapted for the gigahertz bands. The lower the dielectric dissipation factor is, the smaller the transmission loss is. Thus, such a thermoplastic liquid crystal polymer film can be suitably used for a transmission circuit so as to reduce power consumption and/or noise.

Dielectric Constant

The thermoplastic liquid crystal polymer film of the present invention may have, for example, a dielectric constant of 2.5 to 4.0 (for example, about 2.6 to 4.0) and preferably of about 2.8 to 4.0 at 25° C. and 5 GHz. The film may also have a dielectric constant of 2.5 to 4.0 (for example, about 2.6 to 4.0) and preferably of about 2.8 to 4.0 at 40° C. and 24 GHz. The film may further have a dielectric constant of 2.5 to 4.0 (for example, about 2.6 to 4.0) and preferably of about 2.8 to 4.0 at 120° C. and 24 GHz. It should be noted that a dielectric constant is a value measured according to the method recited in Examples described later. The dielectric constant is calculated as an average of dielectric constants measured at a predetermined frequency (and a temperature) in one direction (X direction) and a transverse direction (Y direction) perpendicular to the X direction.

Metal-Clad Laminate

An aspect of the present invention may include a metal-clad laminate having a thermoplastic liquid crystal polymer film and a metal layer (for example, a metal sheet) bonded to at least one surface of the thermoplastic liquid crystal polymer film.

The metal layer may be formed from, for example, gold, silver, copper, iron, nickel, aluminum, or an alloy thereof. The metal-clad laminate may preferably be a copper-clad laminate.

A circuit board can be obtained by subjecting the metal-clad laminate to a known or conventional process to form a circuit pattern on the metal layer part.

Circuit Board

According to one embodiment of the present invention, a circuit board includes at least one conductor layer and at least one insulator (or dielectric) layer. As long as the thermoplastic liquid crystal polymer film is used as an insulator (or a dielectric), configurations of the circuit board are not particularly limited, and the circuit board can be obtained by a known or conventional means and used as various high-frequency circuit boards. In addition, the circuit board may be a circuit board having a semiconductor element (for example, an IC chip) mounted thereon (or a substrate on which a semiconductor chip(s) is(are) mounted).

Conductor Layer

A conductor layer is formed from, for example, a metal at least having conductivity, and a circuit is formed on the conductor layer using a known method for processing a circuit. Conductors for forming a conductor layer may include various metals having conductivity, such as gold, silver, copper, iron, nickel, aluminum, or an alloy thereof.

In particular, since the circuit board as one aspect of the present invention has a dielectric dissipation factor that is controlled to be extremely low, it may be used for various transmission lines (for example, known or conventional transmission lines, such as coaxial lines, strip lines, microstrip lines, coplanar lines, parallel lines), and for antennas (for example, microwave or millimeter-wave antennas). The circuit board may also be used for an antenna device having an antenna and a transmission line integrated.

The antenna may include antennas using milli-meter wave or microwave, such as waveguide slot antennas, horn antennas, lens antennas, printed antennas, triplate antennas, microstrip antennas, and patch antennas.

For example, such an antenna has, as a base material of the antenna, at least a circuit board (preferably, a multilayer circuit board) that comprises at least one conductor layer and at least one insulator (or a dielectric) formed from the thermoplastic liquid crystal polymer film of the present invention.

The circuit board (or a substrate on which a semiconductor chip(s) is(are) mounted) according to the present invention is preferably used for various sensors and, in particular, vehicular radars. The various sensors, in particular, vehicular radars, may at least include, for example, a circuit board comprising the thermoplastic liquid crystal polymer film of the present invention and a semiconductor element (for example, an IC chip).

EXAMPLES

Hereafter, the present invention will be described in detail with reference to Examples; however, the present invention is not limited to these Examples. Various physical properties discussed in the Examples and Comparative Examples were measured by the following procedures.

Melting Point

A melting point of a sample is an endothermic peak temperature measured for 5 mg of the sample using a DSC Q2000 (produced by TA Instruments Japan, Inc.), by heating the sample at a speed of 20° C. per minute from a room temperature to a temperature at which the sample was polymerized, maintaining the sample at that temperature for 2 minutes, cooling it to 25° C. at a speed of 20° C. per minute, maintaining it at 25° C. for 2 minutes, and then heating it again at a speed of 20° C. per minute.

Solidifying Temperature

The solidifying temperature is an exothermic peak temperature (crystallization temperature) in the cooling process in the above measurement of the melting point. In the case where a crystallization temperature is not observed, the solidifying temperature is a glass transition temperature observed in the cooling process in the above measurement of the melting point.

Dielectric Characteristics at 25° C. and 5 GHz

Sample Preparation

A thermoplastic liquid crystal polymer was subjected to heat pressing in a condition of $(Tm_0+15)$ to $(Tm_0+30)°$ C. under pressure of 100 kg/cm$^2$ to obtain a 12-cm square sheet with a thickness of 125 μm, a length of 12 cm, and a width of 12 cm. Then, the resultant sheet was cut in the horizontal direction (X direction) of the sheet to obtain sample pieces with a length of 8 cm, a width of 2 mm, and a thickness of 125 μm. Another sheet was obtained in the same manner and was cut in the vertical direction (Y direction) of the sheet to obtain sample pieces with a length of 8 cm, a width of 2 mm, and a thickness of 125

Method of Measurement

Measurement of dielectric constants and dielectric dissipation factors were performed by a perturbation method using a cavity resonator at a frequency of 5 GHz. A cavity resonator (produced by KANTO Electronic Application and Development Inc.) at 5 GHz was connected to a network analyzer (produced by Agilent Technologies, Inc., "E8362B"), and the above sample pieces were inserted into the cavity resonator to perform the measurement at 25° C. With respect to each of the dielectric constants and the dielectric dissipation factors, the data obtained in the vertical direction and the horizontal direction were calculated into an average value to be adopted.

Dielectric Characteristics at 40° C. and 24 GHz and at 120° C. and 24 GHz

Sample Preparation

A thermoplastic liquid crystal polymer was subjected to hot pressing in a condition of $(Tm_0+20)$ to $(Tm_0+30)°$ C. under pressure of 100 kg/cm² to obtain a 10-cm square sheet with a thickness of 1 mm, a length of 10 cm, and a width of 10 cm. Then, the resultant sheet was cut in the horizontal direction of the sheet while adjusting the width (about 1.6 mm) so as to have a diagonal length of 1.87 mm in the cross section, and thereby to obtain sample pieces with a length of 40 mm, a width of about 1.6 mm, and a thickness of 1 mm. Another sheet was obtained in the same manner and was cut in the vertical direction of the sheet to obtain sample pieces with a length of 40 mm, a width of about 1.6 mm, and a thickness of 1 mm.

Method of Measurement

According to a method described by Kentaro Mori and Atsuhiro Nishikata, "Temperature evaluation at sample location and measurement of the liquid crystal polymer film's complex permittivity by temperature-controlled waveguide penetration method", Program of Society Conference 2016, the Institute of Electronics, Information and Communication Engineers, B-4-44, measurement of the above sample pieces was performed. Measurement was performed for the dielectric constants and dielectric dissipation factors at 24 GHz, at temperatures of 40° C. and 120° C. With respect to each of the dielectric constants and the dielectric dissipation factors, the data obtained in the vertical direction and the horizontal direction were calculated into an average value to be adopted.

Example 1

Into a 100-mL reactor, were introduced 19.74 g of 6-hydroxy-2-naphthoic acid (60 mol %), 7.56 g of 2,6-naphthalenedicarboxylic acid (20 mol %), 0.96 g of hydroquinone (5 mol %), 4.88 g of 4,4'-dihydroxybiphenyl (15 mol %), 19.64 g of acetic anhydride, and 3.77 mg of potassium acetate as a polymerization catalyst. The mixture was acetylated under a nitrogen atmosphere (at 160° C. for about 2 hours under reflux) and then kept at 280° C. for 0.5 hour, at 320° C. for 1 hour and at 360° C. for 1 hour. Then, decompression treatment (100 Pa) was performed until it is confirmed that forming has stopped (for 30 to 120 minutes), and subsequently the reactor was purged with nitrogen to obtain an aromatic liquid crystal polyester.

The resultant thermoplastic liquid crystal polymer had a melting point of 294° C. and a solidifying temperature of 228° C., and a temperature difference between the melting point and the solidifying temperature was 66° C.

The obtained thermoplastic liquid crystal polymer was heat-pressed to obtain a film, and a dielectric constant and a dielectric dissipation factor of the film were measured. The results of the measurement are shown in Table 5.

Example 2

An aromatic liquid crystal polyester was obtained in the same manner as in Example 1, except that the raw materials introduced into the reactor were changed to 20.19 g of 6-hydroxy-2-naphthoic acid (60 mol %), 7.73 g of 2,6-naphthalenedicarboxylic acid (20 mol %), 1.97 g of hydroquinone (10 mol %), 3.33 g of 4,4'-dihydroxybiphenyl (10 mol %), 20.08 g of acetic anhydride, and 3.77 mg of potassium acetate.

The resultant thermoplastic liquid crystal polymer had a melting point of 291° C. and a solidifying temperature of 237° C., and a temperature difference between the melting point and the solidifying temperature was 54° C.

The obtained thermoplastic liquid crystal polymer was heat-pressed to obtain a film, and a dielectric constant and a dielectric dissipation factor of the film were measured. The results of the measurement are shown in Table 5.

Example 3

An aromatic liquid crystal polyester was obtained in the same manner as in Example 1, except that the raw materials introduced into the reactor were changed to 20.66 g of 6-hydroxy-2-naphthoic acid (60 mol %), 7.91 g of 2,6-naphthalenedicarboxylic acid (20 mol %), 3.02 g of hydroquinone (15 mol %), 1.70 g of 4,4'-dihydroxybiphenyl (5 mol %), 20.55 g of acetic anhydride, and 3.77 mg of potassium acetate.

The resultant thermoplastic liquid crystal polymer had a melting point of 309° C. and a solidifying temperature of 252° C., and a temperature difference between the melting point and the solidifying temperature was 57° C.

The obtained thermoplastic liquid crystal polymer was heat-pressed to obtain a film, and a dielectric constant and a dielectric dissipation factor of the film were measured. The results of the measurement are shown in Table 5.

Example 4

An aromatic liquid crystal polyester was obtained in the same manner as in Example 1, except that the raw materials introduced into the reactor were changed to 15.23 g of 6-hydroxy-2-naphthoic acid (45 mol %), 10.69 g of 2,6-naphthalenedicarboxylic acid (27.5 mol %), 2.72 g of hydroquinone (13.75 mol %), 4.60 g of 4,4'-dihydroxybiphenyl (13.75 mol %), 20.19 g of acetic anhydride, and 3.77 mg of potassium acetate.

The resultant thermoplastic liquid crystal polymer had a melting point of 275° C. and a solidifying temperature of 225° C., and a temperature difference between the melting point and the solidifying temperature was 50° C.

The obtained thermoplastic liquid crystal polymer was heat-pressed to obtain a film, and a dielectric constant and a dielectric dissipation factor of the film were measured. The results of the measurement are shown in Table 5.

Example 5

An aromatic liquid crystal polyester was obtained in the same manner as in Example 1, except that the raw materials introduced into the reactor were changed to 10.21 g of 6-hydroxy-2-naphthoic acid (30 mol %), 13.68 g of 2,6-naphthalenedicarboxylic acid (35 mol %), 3.48 g of hydroquinone (17.5 mol %), 5.89 g of 4,4'-dihydroxybiphenyl (17.5 mol %), 20.30 g of acetic anhydride, and 3.77 mg of potassium acetate.

The resultant thermoplastic liquid crystal polymer had a melting point of 317° C. and a solidifying temperature of 240° C., and a temperature difference between the melting point and the solidifying temperature was 77° C.

The obtained thermoplastic liquid crystal polymer was heat-pressed to obtain a film, and a dielectric constant and a dielectric dissipation factor of the film were measured. The results of the measurement are shown in Table 5.

Example 6

An aromatic liquid crystal polyester was obtained in the same manner as in Example 1, except that the raw materials introduced into the reactor were changed to 19.32 g of 6-hydroxy-2-naphthoic acid (60 mol %), 7.40 g of 2,6-naphthalenedicarboxylic acid (20 mol %), 3.19 g of 4,4'-dihydroxybiphenyl (10 mol %), 3.19 g of phenylhydroquinone (10 mol %), 19.21 g of acetic anhydride, and 3.77 mg of potassium acetate.

The resultant thermoplastic liquid crystal polymer had a melting point of 262° C. and a solidifying temperature of 140° C., and a temperature difference between the melting point and the solidifying temperature was 122° C.

The obtained thermoplastic liquid crystal polymer was heat-pressed to obtain a film, and a dielectric constant and a dielectric dissipation factor of the film were measured. The results of the measurement are shown in Table 5.

Example 7

An aromatic liquid crystal polyester was obtained in the same manner as in Example 1, except that the raw materials introduced into the reactor were changed to 19.14 g of 6-hydroxy-2-naphthoic acid (60 mol %), 7.33 g of 2,6-naphthalenedicarboxylic acid (20 mol %), 3.16 g of 4,4'-dihydroxybiphenyl (10 mol %), 3.43 g of 4,4'-dihydroxydiphenyl ether (10 mol %), 19.04 g of acetic anhydride, and 3.77 mg of potassium acetate.

The resultant thermoplastic liquid crystal polymer had a melting point of 261° C. and a solidifying temperature of 110° C., and a temperature difference between the melting point and the solidifying temperature was 151° C.

The obtained thermoplastic liquid crystal polymer was heat-pressed to obtain a film, and a dielectric constant and a dielectric dissipation factor of the film were measured. The results of the measurement are shown in Table 5.

Comparative Example 1

An aromatic liquid crystal polyester was obtained in the same manner as in Example 1, except that the raw materials introduced into the reactor were changed to 18.65 g of 6-hydroxy-2-naphthoic acid (54 mol %), 7.01 g of terephthalic acid (23 mol %), 0.30 g of hydroquinone (1.5 mol %), 7.35 g of 4,4'-dihydroxybiphenyl (21.5 mol %), 19.11 g of acetic anhydride, and 3.77 mg of potassium acetate.

The resultant thermoplastic liquid crystal polymer had a melting point of 342° C. and a solidifying temperature of 306° C., and a temperature difference between the melting point and the solidifying temperature was 36° C.

The obtained thermoplastic liquid crystal polymer was heat-pressed to obtain a film, and a dielectric constant and a dielectric dissipation factor of the film were measured. The results of the measurement are shown in Table 5.

Comparative Example 2

Into a reactor, were introduced 22.64 g of 4-hydroxybenzoic acid (73 mol %), 11.41 g of 6-hydroxy-2-naphthoic acid (27 mol %), 23.38 g of acetic anhydride, and 3.77 mg of potassium acetate. The mixture was acetylated under a nitrogen atmosphere (at 160° C. for about 2 hours under reflux) and then kept at 250° C. for 0.5 hour, at 280° C. for 1 hour and at 320° C. for 1 hour. Then, the decompression treatment (100 Pa) was performed for 30 minutes, and after it is confirmed that forming has stopped, the reactor was purged with nitrogen to obtain an aromatic liquid crystal polyester.

The resultant thermoplastic liquid crystal polymer had a melting point of 278° C. and a solidifying temperature of 237° C., and a temperature difference between the melting point and the solidifying temperature was 41° C.

The obtained thermoplastic liquid crystal polymer was heat-pressed to obtain a film, and a dielectric constant and a dielectric dissipation factor of the film were measured. The results of the measurement are shown in Table 5.

Comparative Example 3

An aromatic liquid crystal polyester was obtained in the same manner as in Example 1, except that the raw materials introduced into the reactor were changed to 20.95 g of 6-hydroxy-2-naphthoic acid (60 mol %), 8.02 g of 2,6-naphthalenedicarboxylic acid (20 mol %), 3.68 g of hydroquinone (18 mol %), 0.69 g of 4,4'-dihydroxybiphenyl (2 mol %), 29.89 g of acetic anhydride, and 3.77 mg of potassium acetate.

The resultant thermoplastic liquid crystal polymer had a melting point of 332° C. and a solidifying temperature of 280° C., and a temperature difference between the melting point and the solidifying temperature was 52° C.

The obtained thermoplastic liquid crystal polymer was heat-pressed to obtain a film, and a dielectric constant and a dielectric dissipation factor of the film were measured. The results of the measurement are shown in Table 5.

Comparative Example 4

An aromatic liquid crystal polyester was obtained in the same manner as in Example 1, except that the raw materials introduced into the reactor were changed to 12.69 g of 6-hydroxy-2-naphthoic acid (40 mol %), 10.93 g of 2,6-naphthalenedicarboxylic acid (30 mol %), 9.42 g of 4,4'-dihydroxybiphenyl (30 mol %), 18.93 g of acetic anhydride, and 3.77 mg of potassium acetate.

The resultant thermoplastic liquid crystal polymer had a melting point of 347° C. and a solidifying temperature of 324° C., and a temperature difference between the melting point and the solidifying temperature was 23° C.

The obtained thermoplastic liquid crystal polymer was heat-pressed to obtain a film, and a dielectric constant and a dielectric dissipation factor of the film were measured. The results of the measurement are shown in Table 5.

TABLE 5

| | | Examples | | | | | | | Comparative Examples | | | |
| --- | --- | --- | --- | --- | --- | --- | --- | --- | --- | --- | --- | --- |
| | | 1 | 2 | 3 | 4 | 5 | 6 | 7 | 1 | 2 | 3 | 4 |
| Monomer ratio (mol %) | HNA | 60 | 60 | 60 | 45 | 30 | 60 | 60 | 54 | 27 | 60 | 40 |
| | HBA | — | — | — | — | — | — | — | — | 73 | — | — |
| | TPA | — | — | — | — | — | — | — | 23 | — | — | — |
| | NDCA | 20 | 20 | 20 | 27.5 | 35 | 20 | 20 | — | — | 20 | 30 |
| | HQ | 5 | 10 | 15 | 13.75 | 17.5 | — | — | 1.5 | — | 18 | — |
| | BP | 15 | 10 | 5 | 13.75 | 17.5 | 10 | 10 | 21.5 | — | 2 | 30 |
| | Ph-HQ | — | — | — | — | — | 10 | — | — | — | — | — |
| | DHBE | — | — | — | — | — | — | 10 | — | — | — | — |

TABLE 5-continued

|  | Examples | | | | | | | Comparative Examples | | | |
| --- | --- | --- | --- | --- | --- | --- | --- | --- | --- | --- | --- |
|  | 1 | 2 | 3 | 4 | 5 | 6 | 7 | 1 | 2 | 3 | 4 |
| Melting point (° C.) | 294 | 291 | 309 | 275 | 317 | 262 | 261 | 342 | 278 | 332 | 347 |
| Average dielectric constant in the X, Y directions (5 GHz and 25° C.) | 3.36 | 3.46 | 3.63 | 3.33 | 3.35 | 3.62 | 3.46 | 3.37 | 2.97 | 3.53 | 3.34 |
| Average dielectric dissipation factor in the X, Y directions (5 GHz and 25° C.) | 0.0006 | 0.0005 | 0.0005 | 0.0006 | 0.0006 | 0.0006 | 0.0006 | 0.0012 | 0.0020 | 0.0006 | 0.0006 |

HNA: 6-hydroxy-2-naphthoic acid;
HBA: 4-hydroxybenzoic acid;
TPA: terephthalic acid;
NDCA: 2,6-naphthalenedicarboxylic acid;
HQ: hydroquinone;
BP: 4,4'-dihydroxybiphenyl;
Ph-HQ: phenylhydroquinone;
DHBE: 4,4'-dihydroxydiphenyl ether As shown in Table 5, Examples 1 to 7 had reduced melting points as well as large temperature differences between the melting points and the solidifying temperatures. Further, the films formed from the resultant thermoplastic liquid crystal polymers had extremely low dielectric dissipation factor at 5 GHz.

Comparative Example 1, which corresponds to a formulation of a thermoplastic liquid crystal polymer of Example in Patent Document 1, had a dielectric dissipation factor of the film at 5 GHz twice or more as high as those of the Examples of the present invention because Comparative Example 1 did not include the repeating unit represented by formula (II) but included a large amount of a repeating unit derived from a different dicarboxylic acid (terephthalic acid). Further, even though Comparative Example 1 includes two repeating units derived from aromatic diols, it had a high melting point because the molar ratio of the repeating units was not in the specific range.

Comparative Example 2 did not include the repeating unit represented by formula (II) and included a small amount of the repeating unit having a naphthalene ring. Thus, the film of Comparative Example 2 had a dielectric dissipation factor at 5 GHz three times or more as high as those of the Examples of the present invention.

Since Comparative Example 3 had a formulation including repeating units represented by formulae (I) and (II), the film of Comparative Example 3 had a dielectric dissipation factor at 5 GHz as low as those of the Examples of the present invention. However, even though Comparative Example 3 included two repeating units derived from aromatic diols, it had a high melting point because the molar ratio of the repeating units was not in the specific range.

Since Comparative Example 4 had a formulation including repeating units represented by formulae (I) and (II), the film of Comparative Example 4 had a dielectric dissipation factor at 5 GHz as low as those of the Examples. However, since Comparative Example 4 included only one repeating unit derived from aromatic diols, it had a high melting point.

Further, Examples 2 and 5 as well as Comparative Example 2 were studied for dielectric characteristics in a higher frequency band (24 GHz). The results are shown in Table 6 below.

TABLE 6

|  | Ex. 2 | Ex. 5 | Com. Ex. 2 |
| --- | --- | --- | --- |
| Average dielectric constant of the X, Y directions (24 GHz and 40° C.) | 3.47 | 3.19 | 3.43 |
| Average dielectric dissipation factor of the X, Y directions (24 GHz and 40° C.) | 0.0009 | 0.0007 | 0.0030 |
| Average dielectric constant of the X, Y directions (24 GHz and 120° C.) | 3.51 | 3.20 | 3.46 |
| Average dielectric dissipation factor of the X, Y directions (24 GHz and 120° C.) | 0.0022 | 0.0018 | 0.0063 |

As shown in Table 6, Examples 2 and 5 had low dielectric dissipation factors even at a higher frequency band (24 GHz). Also, Examples 2 and 5 achieved low dielectric dissipation factors even at a high temperature (120° C.) at which the dielectric dissipation factors would generally rise due to dielectric loss increase as the temperature rises.

In contrast, Comparative Example 2 had a dielectric dissipation factor three times or more as high as those of the Examples at a higher frequency band (24 GHz). In addition, Comparative Example 2 failed to suppress rise in the dielectric dissipation factor at a high temperature (120° C.).

INDUSTRIAL APPLICABILITY

A thermoplastic liquid crystal polymer according to the present invention can be used to form a film having an extremely low dielectric dissipation factor. The thermoplastic liquid crystal polymer film obtained by forming the thermoplastic liquid crystal polymer may suitably be used as substrate materials, in particular, as substrate materials for a radar adapted for the gigahertz bands.

As described above, the present invention has been described as to the preferred embodiments thereof, but one skilled in the art would easily make various changes or modifications in view of the present description, without departing from the spirit or scope of the present invention.

Accordingly, such changes and modifications are construed as within the scope of the invention as defined from the scope of the claims.

What is claimed is:

1. A thermoplastic liquid crystal polymer comprising repeating units derived from hydroxycarboxylic acids, dicarboxylic acids, and diols,
   wherein the repeating units derived from the hydroxycarboxylic acids comprise a repeating unit represented by the following formula (I);
   the repeating units derived from the dicarboxylic acids comprise a repeating unit represented by the following formula (II); and
   the repeating units derived from the diols comprise repeating units represented by the following formulae (III) and (IV):

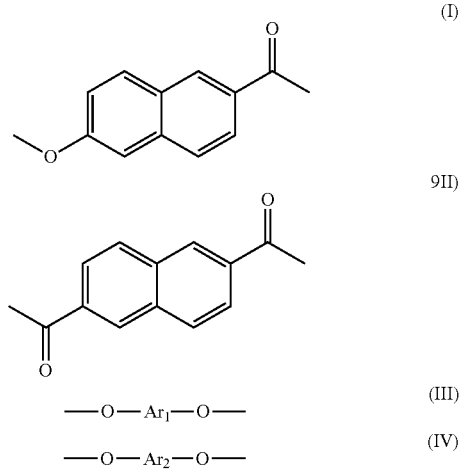

—O—Ar$_1$—O—   (III)

—O—Ar$_2$—O—   (IV)

wherein Ar$_1$ and Ar$_2$ represent divalent aromatic groups that are different from each other, and
   wherein a molar proportion of a total amount of the repeating units represented by formulae (I) and (II) based on a total amount of all repeating units in the thermoplastic liquid crystal polymer is 50 to 90 mol %,
   a molar ratio of the repeating unit represented by formula (III) to the repeating unit represented by formula (IV) is the former/the latter=23/77 to 77/23, and
   a molar proportion of an amount of the repeating unit represented by formula (I) based on a total amount of all the repeating units derived from the hydroxycarboxylic acids in the thermoplastic liquid crystal polymer is 85 mol % or higher.

2. The thermoplastic liquid crystal polymer according to claim 1 wherein a molar ratio of the repeating unit represented by formula (I) to the repeating unit represented by formula (II) is the former/the latter=45/55 to 90/10.

3. The thermoplastic liquid crystal polymer according to claim 1, wherein a molar proportion of an amount of the repeating unit represented by formula (II) based on a total amount of all the repeating units derived from the dicarboxylic acids in the thermoplastic liquid crystal polymer is 85 mol % or higher.

4. The thermoplastic liquid crystal polymer according to claim 1, wherein each of Ar$_1$ and Ar$_2$ is selected from a group consisting of 1,4-phenylene, 1,3-phenylene, 1,5-naphthylene, 2,6-naphthylene, 4,4'-biphenylene, 2,6-anthraquinonylene, and a divalent residue having two or more phenylenes linked by a linking group at the para-position; the linking group is selected from a group consisting of a carbon-carbon bond, an oxy group, an alkylene group with 1 to 3 carbon atoms, an amino group, a carbonyl group, a sulfide group, a sulfinyl group, and a sulfonyl group; and each of Ar$_1$ and Ar$_2$ optionally has a substituent selected from a group consisting of a C$_{1-3}$ alkyl group, a halogen atom, and a phenyl group.

5. The thermoplastic liquid crystal polymer according to claim 1, wherein the repeating units represented by formulae (III) and (IV) are two repeating units derived from two aromatic diols, the two aromatic diols being selected from hydroquinone, 4,4'-dihydroxybiphenyl, phenylhydroquinone, and 4,4'-dihydroxydiphenyl ether.

6. The thermoplastic liquid crystal polymer according to claim 1, wherein the thermoplastic liquid crystal polymer has a melting point and a solidifying temperature, and wherein a difference between the melting point and the solidifying temperature is from 40° C. to 160° C.

7. A thermoplastic liquid crystal polymer film comprising the thermoplastic liquid crystal polymer recited in claim 1.

8. The thermoplastic liquid crystal polymer film according to claim 7, wherein the thermoplastic liquid crystal polymer film has a dielectric dissipation factor of 0.0007 or lower at 25° C. and 5 GHz.

9. A metal-clad laminate comprising the thermoplastic liquid crystal polymer film recited in claim 7 and a metal layer bonded to at least one surface of the thermoplastic liquid crystal polymer film.

10. A circuit board comprising at least one conductor layer and the thermoplastic liquid crystal polymer film recited in claim 7.

11. The circuit board according to claim 10, wherein the circuit board is a multilayered circuit board.

12. The circuit board according to claim 10, wherein the circuit board comprises a semiconductor element mounted thereon.

13. A vehicular radar comprising the circuit board recited in claim 10.

14. The thermoplastic liquid crystal polymer according to claim 1, wherein the molar proportion of the total amount of the repeating units represented by formulae (I) and (II) based on the total amount of all the repeating units in the thermoplastic liquid crystal polymer is 55 to 90 mol %.

* * * * *